United States Patent
Kuan et al.

(10) Patent No.: US 11,119,962 B2
(45) Date of Patent: Sep. 14, 2021

(54) APPARATUS AND METHOD FOR MULTIPLEXING DATA TRANSPORT BY SWITCHING DIFFERENT DATA PROTOCOLS THROUGH A COMMON BOND PAD

(71) Applicant: Realtek Semiconductor Corp., Hsinchu (TW)

(72) Inventors: Chi-Kung Kuan, Taoyuan County (TW); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 541 days.

(21) Appl. No.: 15/496,232

(22) Filed: Apr. 25, 2017

(65) Prior Publication Data

US 2018/0307642 A1 Oct. 25, 2018

(51) Int. Cl.
*G06F 13/20* (2006.01)
*G06F 13/40* (2006.01)
(Continued)

(52) U.S. Cl.
CPC ...... *G06F 13/4022* (2013.01); *G06F 13/4068* (2013.01); *G06F 13/4282* (2013.01); *H01L 23/49816* (2013.01); *H01L 23/49827* (2013.01); *H01L 24/09* (2013.01); *H01L 24/49* (2013.01); *H01L 24/85* (2013.01); (Continued)

(58) Field of Classification Search
CPC ............. G06F 13/4022; G06F 13/4068; G06F 13/4282; H01L 24/85; H01L 24/09; H01L 24/49; H01L 23/49827; H01L 23/49816; H01L 2924/14335; H01L 2924/1432; H01L 2924/15311
See application file for complete search history.

(56) References Cited

U.S. PATENT DOCUMENTS 6,614,091 B1 9/2003 Downey et al.
6,833,286 B2 * 12/2004 Fischer .............. G11C 29/1201
438/107

(Continued)

OTHER PUBLICATIONS

S. W. Amos, et al., Newnes Dictionary of Electronics (4th ed.) (1999).*

(Continued)

*Primary Examiner* — Jing-Yih Shyu
(74) *Attorney, Agent, or Firm* — McClure, Qualey & Rodack, LLP

(57) ABSTRACT

An apparatus includes: a semiconductor die including a first I/O (input/output) pad, a second I/O pad, a switch, and an internal processor, wherein the switch is configured to short the first I/O pad to the second I/O pad when a control signal is asserted; and a semiconductor package including a first bond pad configured to electrically connect to the first I/O pad, a second bond pad configured to electrically connect to the second I/O pad, a first port configured to electrically connect to a high-speed pin of a multi-mode connector, a second port configured to electrically connect to an external processor, a first routing path configured to electrically connect the first port to the first bond pad, and a second routing path configured to electrically connect the second port to the second bond pad.

20 Claims, 2 Drawing Sheets

(51) Int. Cl.
*H01L 23/00* (2006.01)
*H01L 23/498* (2006.01)
*G06F 13/42* (2006.01)

(52) U.S. Cl.
CPC .............. *H01L 2224/48091* (2013.01); *H01L 2224/49175* (2013.01); *H01L 2924/00014* (2013.01); *H01L 2924/1432* (2013.01); *H01L 2924/14335* (2013.01); *H01L 2924/15311* (2013.01)

(56) References Cited

U.S. PATENT DOCUMENTS

| | | |
|---|---|---|
| 7,196,428 B2 | 3/2007 | Chen |
| 7,629,689 B2 | 12/2009 | Maeda |
| 8,420,520 B2 | 4/2013 | Lin et al. |
| 8,535,976 B2 | 9/2013 | Lee et al. |
| 8,948,081 B2 | 2/2015 | Sudak et al. |
| 9,886,413 B2 | 2/2018 | Guillerm et al. |
| 9,929,776 B2 | 3/2018 | McCormack et al. |
| 2008/0001296 A1 | 1/2008 | Tu et al. |
| 2009/0294977 A1* | 12/2009 | Jao ............... H01L 23/5286 257/773 |
| 2010/0065954 A1 | 3/2010 | Tu et al. |
| 2012/0203937 A1* | 8/2012 | Mohanty ............ G06F 13/385 710/16 |
| 2016/0049876 A1* | 2/2016 | Lee .................. H02M 3/33592 363/20 |
| 2017/0103978 A1* | 4/2017 | Prechtl ............. H01L 21/4825 |

OTHER PUBLICATIONS

TW Office Action dated Apr. 27, 2018 in Taiwan application (No. 106126255).
Search Report issued in TW Office Action dated Apr. 27, 2018 in Taiwan application (No. 106126255).
Non-Final Office Action issued in U.S. Appl. No. 15/646,147 dated Sep. 20, 2018.

* cited by examiner

APPARATUS AND METHOD FOR MULTIPLEXING DATA TRANSPORT BY SWITCHING DIFFERENT DATA PROTOCOLS THROUGH A COMMON BOND PAD

BACKGROUND OF THE INVENTION

Field of the Invention

The present invention generally relates to data transport, and more particularly to an apparatus and method for multiplexing data transport.

Description of Related Art

Data transports are widely used. A protocol is needed in a data transport. Recently, a USB (universal serial bus) type-C connector standard has been adopted. A USB type-C standard compliant connector allows a user to use the same physical pin for transporting data of different protocols. For instance, the same physical pin and the electrical signal thereof used for transporting data in accordance with a USB protocol can also be used for transporting data in accordance with a DisplayPort protocol. For different protocols, however, the corresponding electrical signals need to be processed differently. A multiplexing function is typically used to process the electrical signal in accordance with the protocol that is being used.

What are desired are apparatus and methods for multiplexing electrical signals of a high-speed pin of a multi-mode connector in accordance with a protocol that is being used for a data transport associated with the electrical signal.

BRIEF SUMMARY OF THIS INVENTION

In an embodiment, an apparatus includes: a semiconductor die including a first I/O (input/output) pad, a second I/O pad, a switch, and an internal processor, wherein the switch is configured to short the first I/O pad to the second I/O pad when a control signal is asserted; and a semiconductor package including a first bond pad configured to electrically connect to the first I/O pad, a second bond pad configured to electrically connect to the second I/O pad, a first port configured to electrically connect to a high-speed pin of a multi-mode connector, a second port configured to electrically connect to an external processor, a first routing path configured to electrically connect the first port to the first bond pad, and a second routing path configured to electrically connect the second port to the second bond pad, wherein the external processor is configured to process an electrical signal at the second port in accordance with a first protocol when the control signal is asserted, and the internal processor is configured to process an electrical signal at the first I/O pad when the control signal is de-asserted. In an embodiment, the first bond pad electrically connects to the first I/O pad via a first bond wire, while the second bond pad electrically connects to the second I/O pad via a second bond wire. In an embodiment, the first bond wire and second bond wire are substantially parallel and adjacent to each other. In an embodiment, the semiconductor package is a BGA (ball grid array) package. In an embodiment, the first routing path includes a metal trace. In an embodiment, the first routing path further includes a via. In an embodiment, the second routing path includes a via. In an embodiment, the first port electrically connects to the high-speed pin of the multi-mode connector via a first metal trace laid out on a PCB (printed circuit board), while the second port electrically connects to the external processor via a second metal trace laid out on the PCB. In an embodiment, the first metal trace and the second metal trace are laid out on different layers of the PCB.

In an embodiment, a method comprises: electrically connecting a first port and a second port of a semiconductor package to a high-speed pin of a multi-mode connector and an external processor, respectively, wherein the external processor is configured to process an electrical signal from/to the second port in accordance with a first protocol when a control signal is asserted; electrically connecting the first port and the second port to a first bond pad and a second bond pad of the semiconductor package, respectively; electrically connecting the first bond pad and the second bond pad to a first I/O pad and a second I/O pad of a semiconductor die, respectively; checking if the control signal is asserted; if true, shorting the first I/O pad with the second I/O pad using a switch; else, processing an electrical signal at the first I/O pad using an internal processor in accordance with a second protocol. In an embodiment, the first port electrically connects to the first bond pad via a first routing path, while the second port electrically connects to the second bond pad via a second routing path. In an embodiment, the first bond pad electrically connects to the first I/O pad via a first bond wire, while the second bond pad electrically connects to the second I/O pad via a second bond wire. In an embodiment, the first bond wire and second bond wire are substantially parallel and adjacent to each other. In an embodiment, the semiconductor package is a BGA (ball grid array) package. In an embodiment, the first routing path includes a metal trace. In an embodiment, the first routing path further includes a via. In an embodiment, the second routing path includes a via. In an embodiment, the first port electrically connects to the high-speed pin of the multi-mode connector via a first metal trace laid out on a PCB (printed circuit board), while the second port electrically connects to the external processor via a second metal trace laid out on the PCB. In an embodiment, the first metal trace and the second metal trace are laid out on different layers of the PCB.

DETAILED DESCRIPTION OF THIS INVENTION

The present invention relates to data transport. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "electrical signal," "semiconductor die," "semiconductor package," "port," "bond pad," "I/O pad," "bond wire," "switch," "PCB (printed circuit board)," "connector," "data transport," and "protocol." Terms and basic concepts like these are apparent to those of ordinary skill in the art and thus will not be explained in detail here.

A logical signal is a signal of two possible states: "1" and "0." A logical signal is said to be "asserted" when it is in the "1" state, and said to be "de-asserted" when it is in the "0" state.

In this disclosure, a "processor" is an apparatus configured to process an electrical signal to fulfill a function related to data transport. For instance, a processor might be configured to fulfill a transmit function wherein a data stream is converted to the electrical signal in accordance with a certain protocol. On the other hand, a processor might be configured to fulfill a receive function wherein an electrical signal is converted to a data stream in accordance with a certain protocol.

Figure 1:
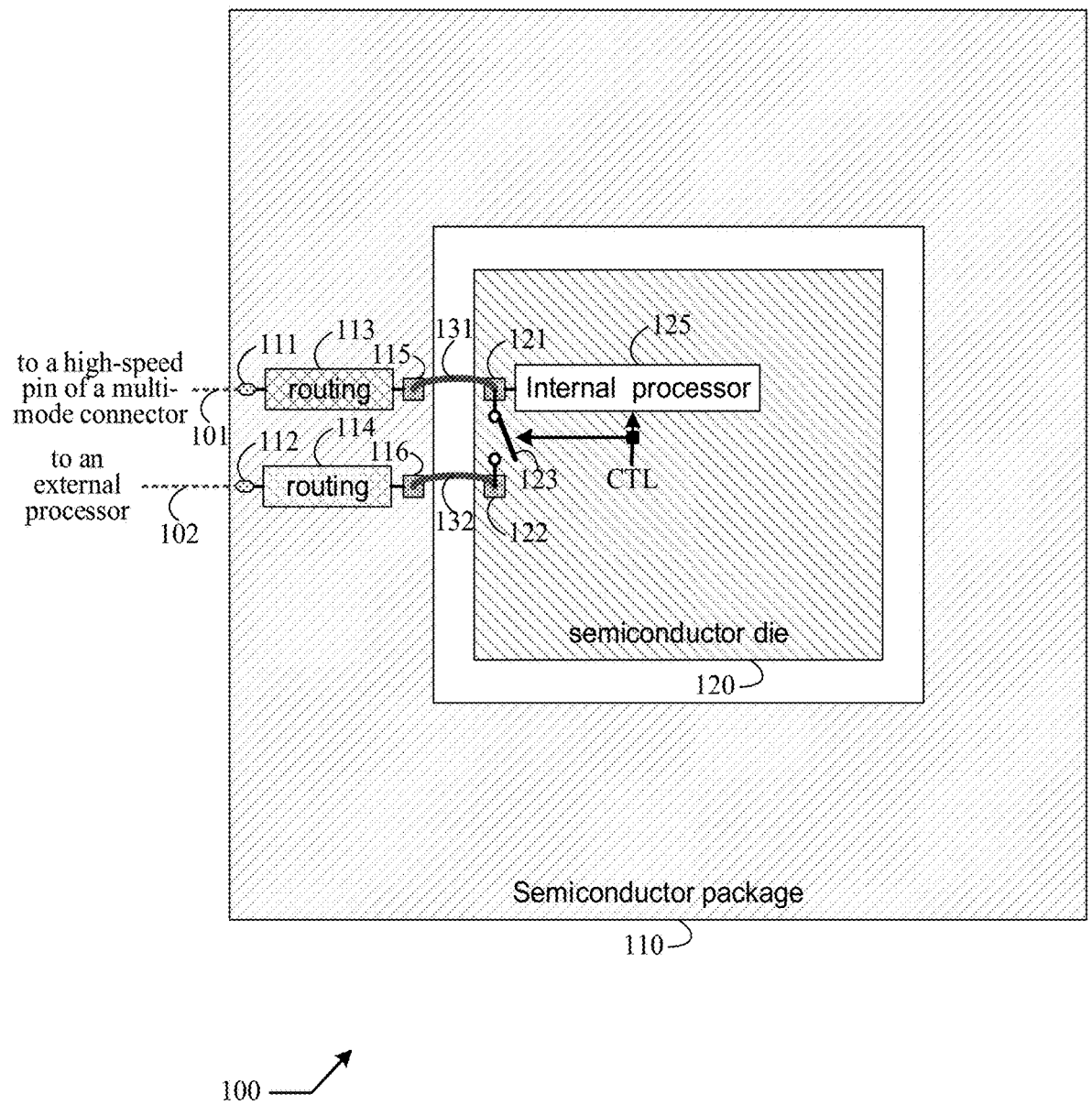
FIG. 1 shows a schematic diagram of an apparatus in accordance with an embodiment of the present invention.

A schematic diagram of an apparatus 100 in accordance with an embodiment of the present invention is depicted in FIG. 1. The apparatus 100 includes a semiconductor die 120 and a semiconductor package 110. The semiconductor die 120 includes a first I/O (input/output) pad 121, a second I/O pad 122, a switch 123, and an internal processor 125. The switch 123 is controlled by a control signal CTL, which is a logical signal, and configured to short the first I/O pad 121 with the second I/O pad 122 when the control signal CTL is asserted. The internal processor 125 is also controlled by the control signal CTL, and activated when the control signal CTL is de-asserted. The semiconductor package 110 comprises a first port 111, a second port 112, a first routing path 113, a second routing path 114, a first bond pad 115, and a second bond pad 116. The first port 111 electrically connects to the first bond pad 115 via the first routing path 113, while the second port 112 electrically connects to the second bond pad 116 via the second routing path 114.

In an embodiment, the apparatus 100 further comprises a first bond wire 131 configured to connect the first bond pad 115 to the first I/O pad 121, and a second bond wire 132 configured to connect the second bond pad 116 to the second I/O pad 122. The first port 111 electrically connects to a high-speed pin of a multi-mode connector as illustrated by a first dash line 101, while the second port 112 electrically connects to an external processor as illustrated by a second dash line 102.

The apparatus 100 is configured to provide a multiplexing function to support a multi-mode data transport function. By way of example but not limitation, said multi-mode connector is a USB type-C connector, wherein an electrical signal at said high-speed pin of said multi-mode connector is of either a USB or a DisplayPort protocol. The high-speed pin electrically connects to the first port 111 (see the first dash line 101), and thus also electrically connects to the first I/O pad 121 via a concatenation of the first routing path 113, the first bond pad 115, and the first bond wire 131. When the protocol of the electrical signal at the high-speed pin of the multi-mode connector is USB (DisplayPort), the control signal CTL is asserted (de-asserted), thus turning on (off) the switch 123 and de-activating (activating) the internal processor 125. In an embodiment, when activated, the internal processor 125 is configured to process the electrical signal at the first I/O pad 121 in accordance with the DisplayPort protocol, and thus effectively process the electrical signal at the high-speed pin of the multi-mode connector in accordance with the DisplayPort protocol. When the control signal CTL is asserted, the electrical signal at the first I/O pad 121 is not processed by the internal processor 125, but instead relayed to the external processor via a concatenation of the switch 123, the second I/O pad 122, the second bond wire 132, the second bond pad 116, the second routing path 114, and the second port 112.

In an embodiment, the external processor processes the electrical signal at the second port 112 in accordance with a USB protocol. Therefore, when the control signal CTL is asserted, the electrical signal at the high-speed pin of the multi-mode connector is effectively processed by the external processor in accordance with a USB protocol. In other words, the apparatus 100 is configured to process the electrical signal at the high-speed pin of the multi-mode connector locally if the protocol is DisplayPort, otherwise relay the electrical signal to the external processor via the second port 112.

In an embodiment, the first bond wire 131 and the second bond wire 132 are substantially parallel and adjacent to each other. Such arrangement helps to mitigate the overall inductance of the first bond wire 131 and the second bond wire 132 when the control signal CTL is asserted, thanks to an opposite direction of current flow.

In an embodiment, the semiconductor package 110 is a BGA (ball grid array) package, wherein both the first port 111 and the second port 112 are balls. In an embodiment, the first routing path 113 includes a metal trace. In an embodiment, the first routing path 113 further includes a via. In an embodiment, the second routing path 114 includes a via. In an embodiment, the semiconductor package 110 is attached to a PCB (printed circuit board, not explicitly shown in FIG. 1, but implied by the first dash line 101 and the second dash line 102), wherein the first port 111 contacts a first soldering pad and the second port 112 contacts a second soldering pad of the PCB. In an embodiment, the first soldering pad is configured to electrically connect to the high-speed pin of the multi-mode connector via a first metal trace of the PCB, while the second soldering pad is configured to electrically connect to the eternal processor via a second metal trace of the PCB. In an embodiment, the first metal trace and the second metal trace are laid out on two different layers of the PCB.

In an alternative embodiment, the semiconductor package 110 is a flip-chip package, wherein the first bond pad 115 directly touches the first I/O pad 121 and the second bond pad 116 directly touches the second I/O pad 122 and therefore the first bond wire 131 and the second bond wire 132 are not needed.

In another embodiment, the semiconductor package 110 is a QFP (quad flat package) package.

In a yet another embodiment, the semiconductor package 110 is a QFN (quad flat no-lead) package.

Figure 2:
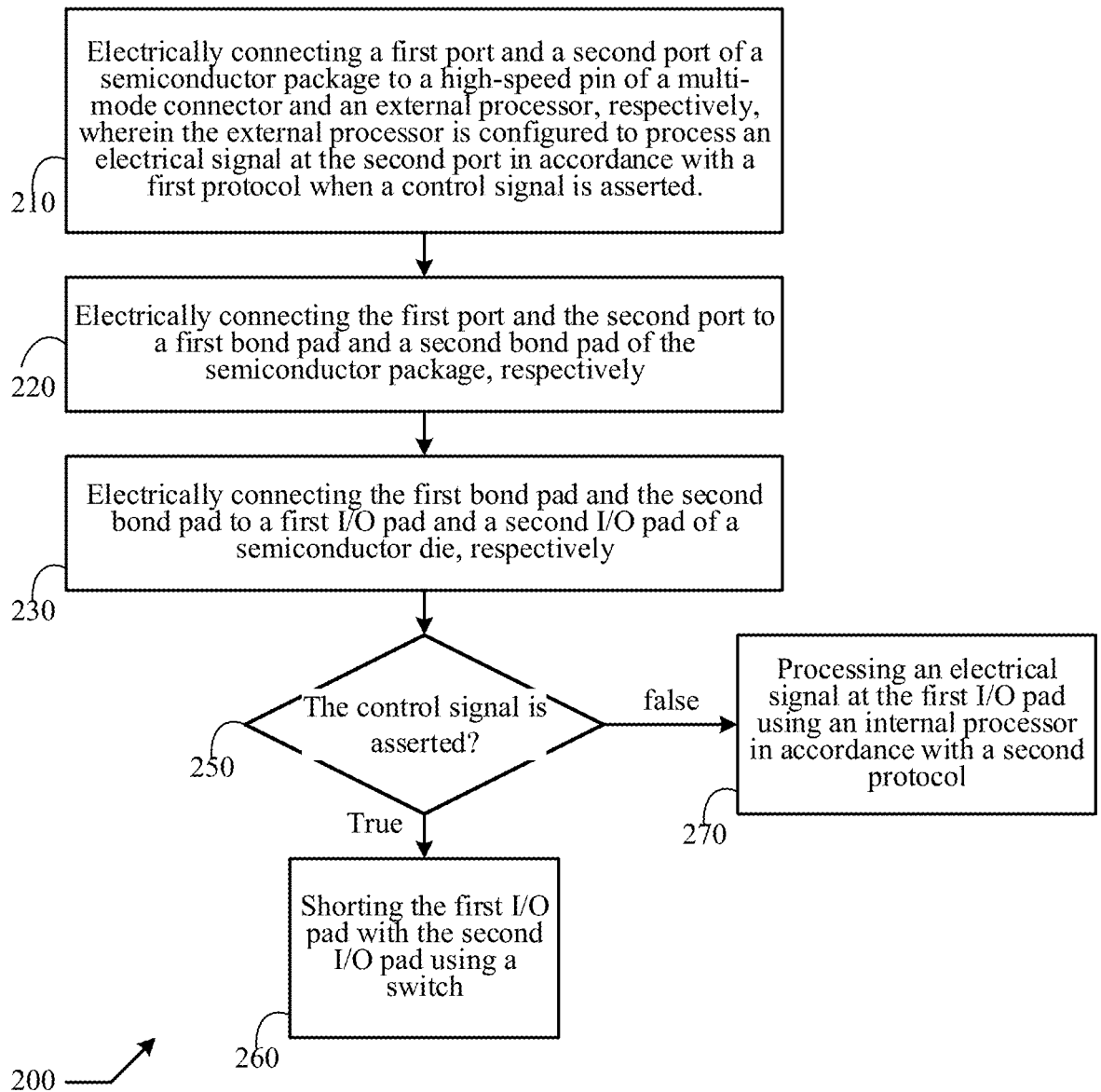
FIG. 2 shows a flow diagram of a method in accordance with an embodiment of the present invention.

In an embodiment illustrated by a flow diagram 200 depicted in FIG. 2, a method comprises: electrically connecting a first port and a second port of a semiconductor package to a high-speed pin of a multi-mode connector and an external processor, respectively, wherein the external processor is configured to process an electrical signal from/to the second port of the semiconductor package in accordance with a first protocol when a control signal is asserted. (step 210); electrically connecting the first port and the second port of the semiconductor package to a first bond pad and a second bond pad of the semiconductor package, respectively (step 220); electrically connecting the first bond pad and the second bond pad of the semiconductor package to a first I/O pad and a second I/O pad of a semiconductor die, respectively (step 230); checking if the control signal is asserted (step 250); if true, shorting the first I/O pad with the second I/O pad using a switch (step 260); if false, processing an electrical signal at the first I/O pad using an internal processor in accordance with a second protocol (step 270).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
a semiconductor die including a first I/O (input/output) pad, a second I/O pad, a switch, and an internal processor, wherein the switch is configured to selectively short the first I/O pad to the second I/O pad in response to an on-die control signal being asserted; and
a semiconductor package including a first bond pad configured to electrically connect to the first I/O pad, a second bond pad configured to electrically connect to the second I/O pad, a first port configured to electrically connect to a high-speed pin of a multi-mode connector, a second port configured to electrically connect to an external processor, a first routing path configured to electrically connect the first port to the first bond pad, and a second routing path configured to electrically connect the second port to the second bond pad, wherein the external processor is configured to process an electrical signal from/to the second port in accordance with a first protocol when the control signal is asserted, and the internal processor is configured to process an electrical signal at the first I/O pad in accordance with a second protocol when the on-die control signal is de-asserted.

2. The apparatus of claim 1, wherein the first bond pad electrically connects to the first I/O pad via a first bond wire, while the second bond pad electrically connects to the second I/O pad via a second bond wire.

3. The apparatus of claim 2, wherein the first bond wire and second bond wire are substantially parallel and adjacent to each other.

4. The apparatus of claim 1, wherein the semiconductor package is a BGA (ball grid array) package.

5. The apparatus of claim 4, wherein the first routing path includes a metal trace.

6. The apparatus of claim 5, wherein the first routing path further includes a via.

7. The apparatus of claim 4, wherein the second routing path includes a via.

8. The apparatus of claim 1, wherein the first port electrically connects to the high-speed pin of the multi-mode connector via a first metal trace laid out on a PCB (printed circuit board), while the second port electrically connects to the external processor via a second metal trace laid out on the PCB.

9. The apparatus of claim 8, wherein the first metal trace and the second metal trace are laid out on different layers of the PCB.

10. The apparatus of claim 1, wherein the first protocol is a USB (universal serial bus) protocol, while the second protocol is a DisplayPort protocol.

11. A method comprising:
electrically connecting a first port and a second port of a semiconductor package to a high-speed pin of a multi-mode connector and an external processor, respectively, wherein the external processor is configured to process an electrical signal from/to the second port in accordance with a first protocol when an on-die control signal is asserted;
electrically connecting the first port and the second port to a first bond pad and a second bond pad of the semiconductor package, respectively;
electrically connecting the first bond pad and the second bond pad to a first I/O pad and a second I/O pad of a semiconductor die, respectively;
checking if the control signal is asserted;
in response to the on-die control signal being asserted, shorting the first I/O pad with the second I/O pad using a switch;
in response to the on-die control signal not being asserted, processing an electrical signal at the first I/O pad using an internal processor in accordance with a second protocol.

12. The method of claim 11, wherein the first bond pad electrically connects to the first I/O pad via a first bond wire, while the second bond pad electrically connects to the second I/O pad via a second bond wire.

13. The method of claim 12, wherein the first bond wire and second bond wire are substantially parallel and adjacent to each other.

14. The method of claim 11, wherein the semiconductor package is a BGA (ball grid array) package.

15. The method of claim 14, wherein a first routing path includes a metal trace.

16. The method of claim 15, wherein the first routing path further includes a via.

17. The method of claim 14, wherein a second routing path includes a via.

18. The method of claim 11, wherein the first port electrically connects to the high-speed pin of the multi-mode connector via a first metal trace laid out on a PCB (printed circuit board), while the second port electrically connects to the external processor via a second metal trace laid out on the PCB.

19. The method of claim 18, wherein the first metal trace and the second metal trace are laid out on different layers of the PCB.

20. The method of claim 11, wherein the first protocol is a USB (universal serial bus) protocol, while the second protocol is a DisplayPort protocol.

* * * * *